US006326787B1

(12) United States Patent
Cowgill

(10) Patent No.: US 6,326,787 B1
(45) Date of Patent: Dec. 4, 2001

(54) NMR OF THIN LAYERS USING A MEANDERLINE SURFACE COIL

(75) Inventor: Donald F. Cowgill, San Ramon, CA (US)

(73) Assignee: Sandia National Laboratories, Livermore, CA (US)

(*) Notice: Subject to any disclaimer, the term of this patent is extended or adjusted under 35 U.S.C. 154(b) by 0 days.

(21) Appl. No.: 09/329,469

(22) Filed: Jun. 10, 1999

(51) Int. Cl.⁷ ..................................................... G01V 3/00
(52) U.S. Cl. .............................................................. 324/318
(58) Field of Search ..................................... 324/318, 307

(56) References Cited

U.S. PATENT DOCUMENTS 5,365,171 * 11/1994 Buess et al. ......................... 324/307

OTHER PUBLICATIONS

Bogacz, S.A., et al. "New Techniques For Excitation of Bulk and Surface Spin Waves in Ferromagnets," J. App. Phys. 58(5), pp. 1935–1942, Sep. 1, 1985.
Buess, M.L., et al., "NQR Detection Using a Meanderline Surface Coil," J. Magn. Resonance (92), pp. 348–362 (1991).
Spulak, Jr., R.G., "Detection of Alpher–Rubin attenuation and a search for nuclear acoustic resonance of surface waves in tantalum films," Phys. Rev. B, 40(9), pp. 6052–6057, Sep. 15, 1989.

* cited by examiner

Primary Examiner—Hezron Williams
Assistant Examiner—Dixomara Vargas
(74) Attorney, Agent, or Firm—L. E. Carnahan; T. P. Evans

(57) ABSTRACT

A miniature meanderline sensor coil which extends the capabilities of nuclear magnetic resonance (NMR) to provide analysis of thin planar samples and surface layer geometries. The sensor coil allows standard NMR techniques to be used to examine thin planar (or curved) layers, extending NMRs utility to many problems of modern interest. This technique can be used to examine contact layers, non-destructively depth profile into films, or image multiple layers in a 3-dimensional sense. It lends itself to high resolution NMR techniques of magic angle spinning and thus can be used to examine the bonding and electronic structure in layered materials or to observe the chemistry associated with aging coatings. Coupling this sensor coil technology with an arrangement of small magnets will produce a penetrator probe for remote in-situ chemical analysis of groundwater or contaminant sediments. Alternatively, the sensor coil can be further miniaturized to provide sub-micron depth resolution within thin films or to orthoscopically examine living tissue. This thin-layer NMR technique using a stationary meanderline coil in a series-resonant circuit has been demonstrated and it has been determined that the flat meanderline geometry has about he same detection sensitivity as a solenoidal coil, but is specifically tailored to examine planar material layers, while avoiding signals from the bulk.

4 Claims, 5 Drawing Sheets

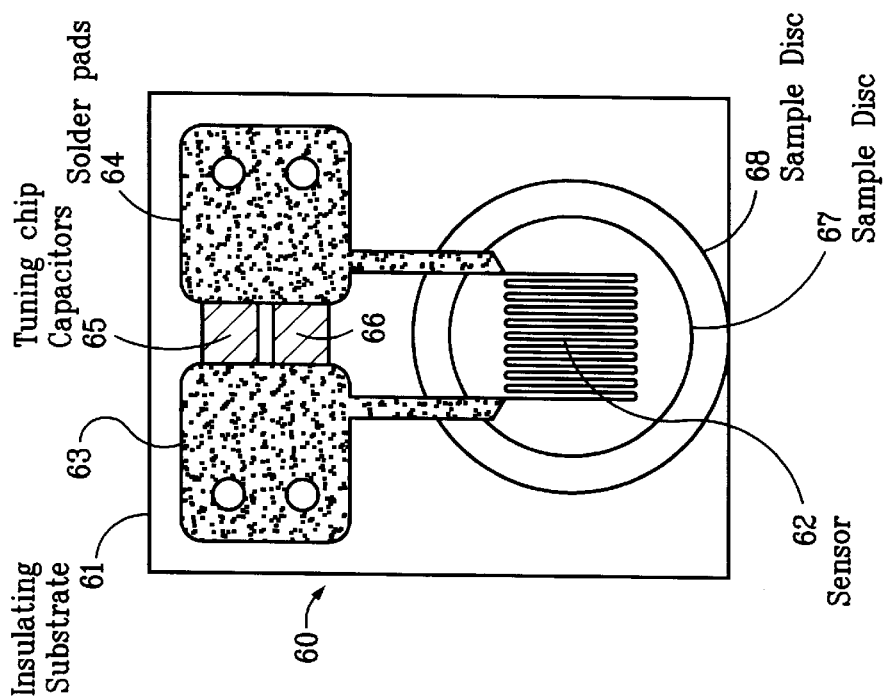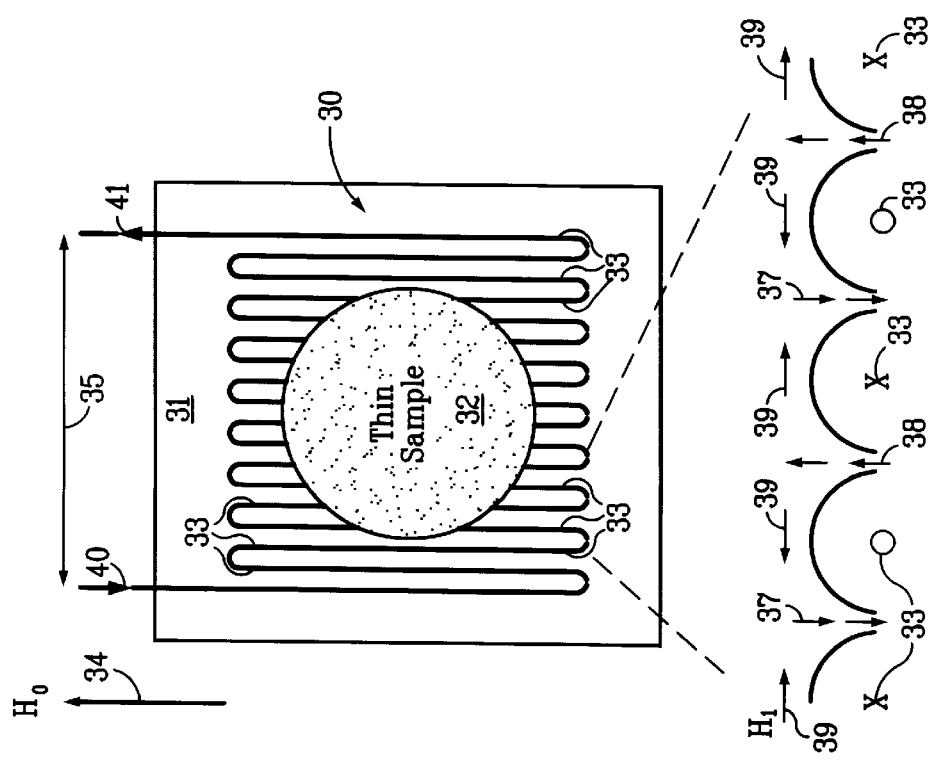

NMR OF THIN LAYERS USING A MEANDERLINE SURFACE COIL

The United States Government has rights in this invention pursuant to Contract No. AC04-94AL-85000 between the United States Department of Energy and the Sandia Corporation for operation of the Sandia National Laboratories.

BACKGROUND OF THE INVENTION

The present invention relates to nuclear magnetic resonance (NMR), particularly to the use of NMR for the analysis of thin planar or curved layer and surface layer geometries, and more particularly to a sensor using a miniaturized meanderline surface coil for NMR analysis of contact layers, non-destructive depth profiling to films, or imaging thin multilayers in a 3-D sense. The invention enables high resolution NMR of the chemistry and physics of surface layers, or layered materials, without the interference of signals from the bulk material.

The nuclear magnetic resonance (NMR) and the magnetic resonance imaging (MRI) technologies are well known. NMR and MRI are normally considered to be bulk techniques for examining short range structure and dynamics in liquid and solid materials. Surface NMR has been observed for absorbed species and surfaces of high surface area powders. Optically detected NMR and surface NMR with polarized atomic beams have sufficient sensitivity to detect signals from flat surfaces but are of low resolution, limited to relaxation studies, and not found widespread use due to their complexities. For the most part, magnetic resonance experiments are usually carried out in the presence of a spatially uniform static DC (direct current) magnetic fields and a spatially uniform radio frequency (RF) excitation fields. In the case of NMR, particle diffusion measurements are generally carried out by applying an inhomogeneous static field rather than using an inhomogeneous RF field. An RF excitation, with a wave vector periodically varying across the plane of the surface of a sample, may be generated by a periodic meanderline.

A meanderline is a zig-zag or serpentine array of parallel conductors of mutual separation, and has been used for several years as an electromagnetic acoustic transducer and has RF magnetic field characteristics which are well understood. Meanderlines have been used for excitation of bulk and surface spin waves in ferromagnets, see S. A. Bogacz, et al. "New Techniques For Excitation of Bulk and Surface Spin Waves in Ferromagnets," J. App. Phys. 58(5), Sep. 1, 1985, and to search for nuclear acoustic resonance effects on surface waves in films, see R. G. Spulak, Jr., "Detection of Alpher-Rubin attenuation and a search for nuclear acoustic resonance of surface waves in tantalum films," Phys. Rev. B, 40(9), Sep. 15, 1989. Also, a meanderline surface coil has been utilized in detecting $^{14}N$ pure nuclear quadrupole resonance (NQR) signals in large thin-layer samples or in regions near the surface of bulk samples while avoiding interfering signals from interior regions. See M. L. Buess, et al., "NQR Detection Using a Meanderline Surface Coil," J. Magn. Resonance 92, 348 (1991), and the meanderline coil thereof, which demonstrated its use for observation of zero-field pure NQR in large samples such as 100 cc of $Na^{14}NO_2$ at 3.6 MHz, and the meanderline thereof is illustrated and will be discussed hereinafter with respect to FIGS. 1 and 2.

In the present invention, the meanderline surface coil, such as shown in FIGS. 1 and 2, has been miniaturized to small planar (or cylindrically curved) samples and applied to the much more useful NMR technique by determining the unique configurations in an external magnetic field which produce the uniform orthogonal RF pulses and allow the magic angle spinning required for high-resolution spectroscopy. Thus, the miniaturized sensor coil of this invention extends the capabilities of NMR to provide analysis of thin planar (or curved) samples and surface layer geometries.

SUMMARY OF THE INVENTION

It is an object of the present invention to provide a miniaturized meanderline surface coil for analysis of thin layers and surface layer geometries.

A further object of the invention is to provide a meanderline surface coil which extends the capabilities of nuclear magnetic resonance (NMR).

Another object of the invention is to provide a thin-layer NMR technique using a stationary meanderline coil in a series-resonant, or parallel resonant circuit.

Another object of the invention is to provide a flat meanderline coil geometry which has about the same detection sensitivity as a solenoidal coil, but is specifically tailored to examine planar layers.

Another object of the invention is to provide a miniaturized meanderline surface coil geometry in an external magnetic field which produces the uniform orthogonal RF pulses.

Another object of the invention is to provide a meanderline configuration comprising the magic angle spinning required for high-resolution NMR spectroscopy.

Other objects and advantages of the present invention will become apparent from the following description and accompanying drawings. The present invention involves NMR of thin layers using a miniaturized meanderline surface coil. The miniature sensor coil, a meanderline surface coil, of this invention extends the capabilities of NMR to provide analysis of thin planar (or curved) surfaces and surface layer geometries. The miniaturized meanderline coil allows standard, pulsed NMR techniques to be used to examine thin layers, extending NMRs utility to many problems of modern interest. For example, the miniature coil can be used to examine contact layers, provide non-destructive depth profiles into films, or image multiple layers in a 3-D sense, as well as for use in high resolution NMR techniques of magic angle, 54.74°, spinning, and thus can be used to quantify the bonding and electronic structure in layered materials, or to observe the chemistry associated with aging coatings. The sensitivity is increased for ultra-thin films by using miniature meanderlines generated by photolithography. Reducing the spacing between the meanderline and sample plane also enhances the sensitivity. Tilting the meanderline and sample relative to the magnetic field allows this spacing to be reduced while maintaining planar uniformity of the RF and detection sensitivity. High speed spinning of the meanderline and sample about an axis parallel to the elements and tilted at the magic angle will average many of the NMR line-broadening interactions and produce high resolution solid-state NMR spectra.

BRIEF DESCRIPTION OF THE DRAWINGS

The accompanying drawings, which are incorporated into and form a part of the disclosure, illustrate embodiments of the invention and, together with the description, serve to explain the principles of the invention.

FIGS. 3A and 3B illustrates an embodiment of a miniature meanderline surface coil, and illustrates that the RF field ($H_1$) is perpendicular to the external field ($H_0$) everywhere.

FIG. 10 illustrates an embodiment of a micro-meanderline surface coil formed by using photolithography and printed circuit techniques.

DETAILED DESCRIPTION OF THE INVENTION

Figure 1:
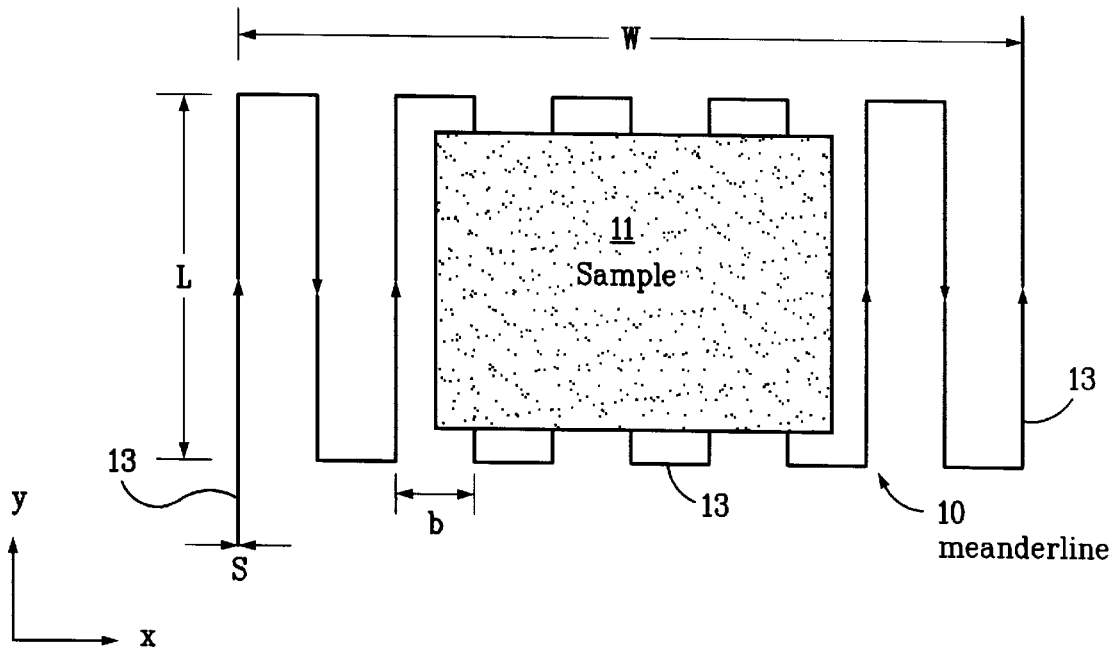
FIGS. 1 and 2 illustrate a prior art meanderline surface coil.

The present invention is directed to a miniaturized or micro-meanderline surface coil which extends the capabilities of nuclear magnetic resonance (NMR) to provide analysis of thin planar (or curved) layers or samples and surface layer geometries. The miniature coil of this invention lends itself to the high resolution NMR techniques of "magic" angle, 54.74°, spinning and thus can be used to study the chemistry and physics of layered materials, or to observe the chemistry associated with aging coatings. Coupling this coil technology with an arrangement of small magnets will produce a penetrator probe for remote in-situ chemical analysis of groundwater or contaminant sediments. Alternatively, the coil can be further miniaturized to provide sub-micron depth resolution within films or to orthoscopically examine living tissue.

The technique involving a meanderline surface coil relies on the fact that large magnetic fields are produced near the surface of a current-carrying conductor. By the principle of reciprocity, these currents are highly sensitive to changes in the magnetic field, or nuclear magnetism, within this near-surface region. Folding the conductor into a flat meanderline creates a wide area, planar "coil" geometry capable of detecting the weak signals from a thin planar sample. As applied to pulsed-NMR, this geometry can produce intense RF pulses and high detection sensitivity near the meanderline elements. Calculations show that a short distance from the meanderline the magnitude of the RF field within a plane is nearly constant, while the phase rotates by 180° per element. For a meanderline oriented with its elements parallel to the external magnetic field, Ho, this rotation only results in a modulation of the zero-time reference of the rotating frame, which produces no effect on the solid-state NMR.

As in bulk pulsed-NMR, normal free induction decay signals can be stimulated by application of a 90° pulse. The field strength decreases exponentially with distance from the meanderline plane. Thus, increasing the RF pulse length (or amplitude) moves the stimulated layer deeper into the film, producing a depth profiling capability. The thickness of the probed layer varies with depth, but is typically the order of the spacing between the meanderline elements. Calculations show that differencing techniques using multiple meanderlines, or multiple pulse sequences, can be used to enhance this depth resolution. Calculations also show that higher sensitivities for ultra-thin films are possible using miniature meanderlines generated by photolithography. The sensitivity is also enhanced by reducing the spacing between the meanderline and sample plane. Tilting the meanderline and sample relative to the magnetic field allows this spacing to be reduced while maintaining planar uniformity of the RF and detection sensitivity. High speed spinning of the meanderline and sample about an axis parallel to the elements and tilted at the magic angle, 54.74°, will average many of the NMR line-broadening interactions and produce high resolution solid-state NMR spectra.

Figure 2:
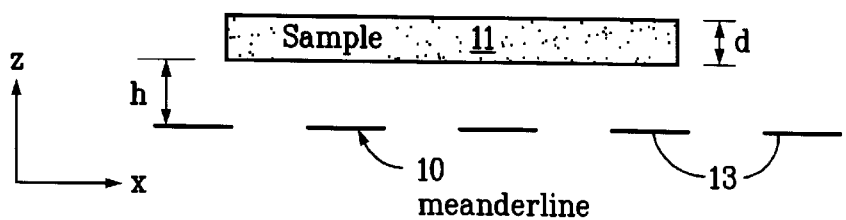

Buess, et al., referenced above, have analyzed the meanderline coil, using the embodiment shown in FIGS. 1 & 2, and demonstrated its use for observation of zero-field pure nuclear quadruple resonance (NQR) in large samples (100 cc of Na $^{14}NO_2$ at 3.6 MHz). As shown in FIGS. 1 and 2, the Buess, et al. arrangement utilized a meanderline surface coil 10 and an $NaNO_2$ sample layer 11, with FIG. 1 showing a top view and FIG. 2 showing a side view, with the corresponding coordinate axes ( Y-X for FIG. 1 and Z-X for FIG. 2 ) shown on the right. The FIGS. 1 and 2 meanderline dimensions are length l=20.3 cm; width w=40.6 cm; height h=4.06 cm (distance from meanderline 10 to sample 11); and the bare copper ribbon wire 13 forming the meanderline having dimensions of 0.8 mm×2.9 mm, and is laid out in eleven (11) strips, as shown, with a spacing b=4.06 cm, the same distance as the height h. The sample 11 has a thickness d=0.3 cm and a surface area of 16.2 cm×20.7 cm. The bold arrows on the wires 13 indicate the directions of current flow.

The meanderline coil of the present invention, while generally similar in appearance to that of FIGS. 1 and 2, has been miniaturized to function with small planar samples, compared to those of Buess, et al., and applied to the much more useful NMR technique (rather than the NQR technique of Buess, et al.) by determining the unique configurations in an external magnetic field which produce the uniform orthogonal RF pulses and allow the magic angle spinning required for high-resolution spectroscopy, as described hereinafter with respect to FIGS. 3–10.

The thin-layer NMR technique using a stationary miniature meanderline coil in a series-resonant circuit has been demonstrated, NMR free induction decay signal were observed from thin (10 to 500 $\mu$m) planar layers of $^{19}F$ in PTFE or TEFLON® tape, $^{27}Al_2O_3$, $^{31}In P$, and $^{69}GaAs$. Solid echoes and quadrupole echoes were generated from $^{69}GaAs$ and $K^{127}I$, respectively. The single pulse signal-to-noise ratio observed at 34.6 MHz with a coarse, 0.8 mm spaced, meanderline (Q≈30) was about 5:1 for a 10 mm×10 mm×0.3 mm $^{69}GaAs$ single crystal oriented $[110]//H_0$. This signal, which results from about $10^{21}$ spins, is comparable to the same system's bulk sensitivity for observing protons in 1 mg of water, with a solenoidal coil de-tuned to Q≈30. That is, the flat meanderline geometry has about the same detection sensitivity as a solenoidal coil, but is specifically tailored to examine planar layers.

It has been determined that aging problems are often 2-dimensional. Degradation occurs at surfaces exposed to environmental attack. Chemistry and material inter-diffusion occurs at buried interfaces. Adhesive layers, sensors, coatings, thin films are often intrinsically planar and interaction ranges are small relative to the geometric features. NMR is a powerful tool for studying chemical and physical aging processes, but in the past NMR has been primarily a bulk technique. RF coils are generally designed for 3-dimensional samples. It has been found that fine powders can be used to produce surface signals comparable to bulk. Surface and interface NMR studies usually use fine powders to produce strong surface signals. Powder studies are not compatible with: 1.) use of reasonably-sized samples with limited surface area, 2.) analysis of an interface between two bulk materials, 3.) examination of effects due to externally imposed stresses, and 4.) the need for depth-dependent information. Use of cylindrical NMR coils for thin planar samples results in: 1.) a poor filling factor and poor signal-to-noise (S/N) ratio, and 2.) significant signal interference from the bulk.

The miniature meanderline surface coil of FIG. 3 and the micro-meanderline surface coil of FIG. 10 are being utilized in developing a new NMR technique optimized to the planar, thin layer geometry. This technique relies, as pointed out above, on the fact that large magnetic fields are produced near the surface of a current-carrying conductor, and by the principle of reciprocity: the inductance of a straight wire is very sensitive to magnetic field perturbations close to the wire. Also as pointed out above, bending the wire into a meanderline produces field/sensitively cancellations a small distance from the plane of the meanderline. The result is: a wide-area, planar "coil" geometry capable of detecting the weak signals from a thin sample; increased filling factors—increase S/N ratios; high sensitivity to near-surface layer; and insensitivity to the bulk materials.

By the present invention it has been shown that NMR is possible by orienting the meanderline elements parallel to the external magnetic field (Ho), and as seen in FIG. 3A wherein a meanderline surface coil 30 formed on a substrate 31 and provided with a thin sample 32, with the elements 33 of the meanderline being composed of gold, silver, or other precious metals, aluminum, copper, and alloys thereof or composed of any other conductor having a resistivity below about 12 $\mu\Omega$-cm. Elements 33 are arranged parallel to the external field as indicated at arrow 34. The meanderline 30 has a width of ~1 cm, as indicated by arrow 35, with eighteen (18) elements 33, having a length of ~1 cm, a width of 0.3 mm, a thickness of 0.3 mm, and a center-to-center spacing from each other of 0.8 mm. The thin samples 32, described previously, are spaced from the meanderline 30 by a distance of 0.01 mm to 1 mm. FIG. 3B is an enlarged cross-section view of five (5) of the elements 33 of FIG. 3A showing that the current flow in each adjacent element alternates direction as indicated by the "o" and "x" symbols used to indicate the direction of current flowing through elements 33 as out of ("o") or into ("x") the plane of the page, and showing further the alternating direction of the RF magnetic field ($H_1$) set up around each of elements 33 and indicated by alternating directions of arrows 37, 38 and 39 in the plane of the page of FIG. 3B. The arrows 40 and 41 indicate the current flow direction through the meanderline 30. As compared to the meanderline and sample of FIGS. 1 and 2, the miniature meanderline 30 and sample 32 of FIG. 3A are very small.

As seen in FIG. 3B, the RF field ($H_1$) is perpendicular to the external field ($H_0$) everywhere. The changing phase of the local rotating reference frame, across the meanderline, has no effect on solid NMR, since the stimulated signals are detected in-phase with the local reference. An additional feature is high sensitivity to motion (fluid flow or diffusion) across the meanderline elements, since the phase of the RF reference changes rapidly.

Figure 4:
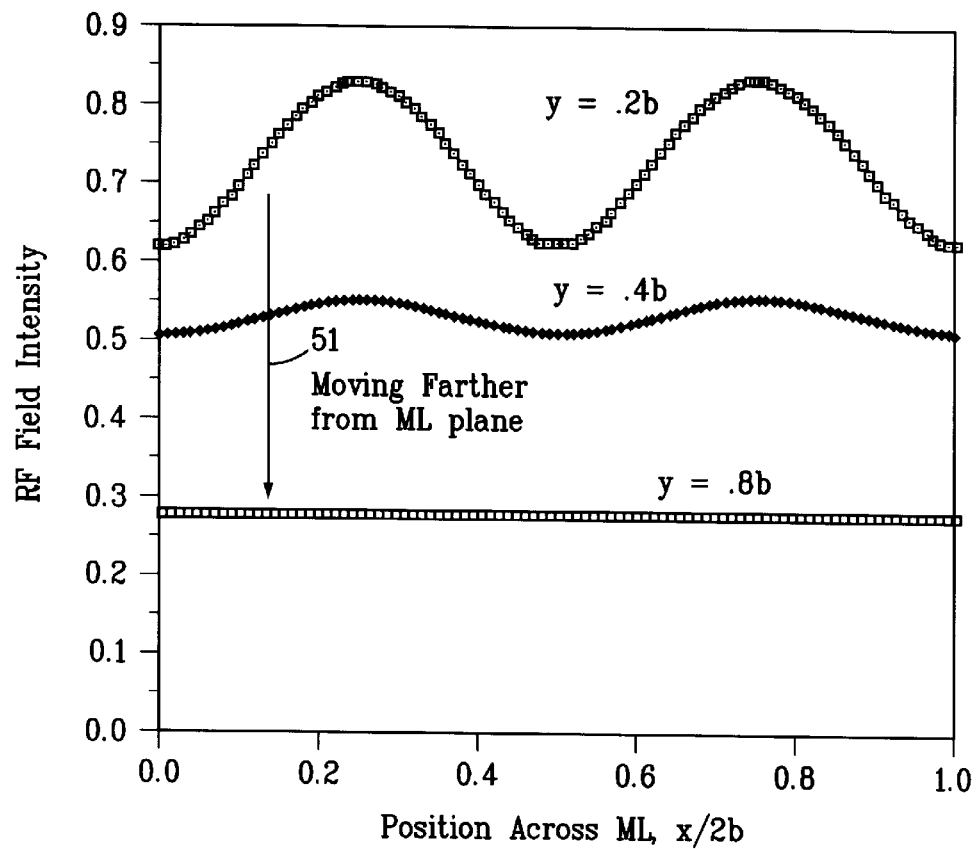
FIG. 4 graphically illustrates that the magnitude of the RF field is nearly uniform a small distance from the meanderline plane.
Figure 5:
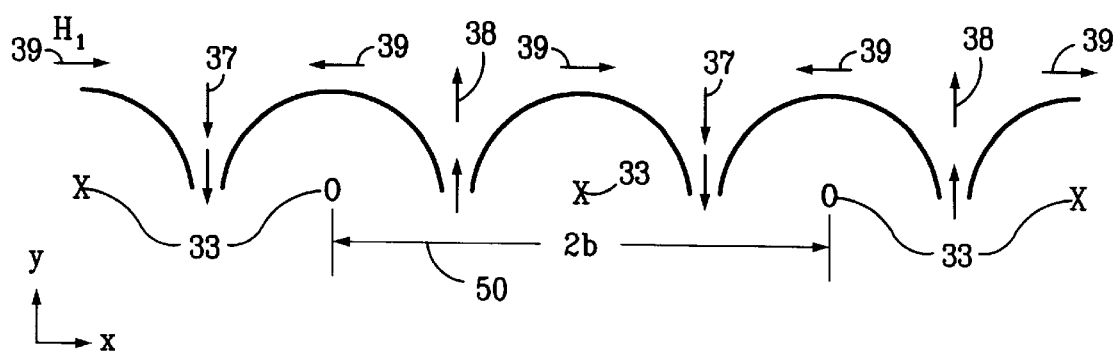
FIG. 5 illustrates that the phase of the RF field rotates with position across the meanderline (ML).

As shown in FIGS. 4 and 5, with FIG. 5 being an enlarged view of FIG. 3B, a small distance from the meanderline (ML) plane, the magnitude of the RF field is nearly uniform. The phase of the RF field rotates with position across the ML, as seen in FIG. 5, but the RF magnitude becomes uniform at a distance y~b/2. Note as shown in FIG. 5 that the distance from alternating elements of the ML is 2b as indicated by arrow 50. The $H_1$ magnitude (and detection sensitivity) decreases exponentially with distance, as indicated by arrow 51 in FIG. 4 and curve 1 in FIG. 6.

Figure 6:
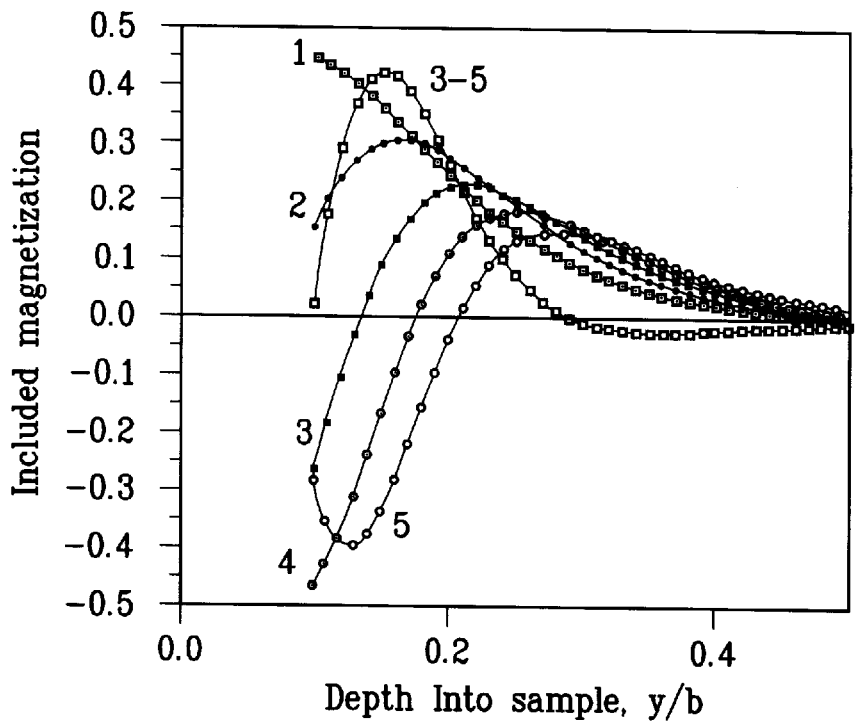
FIG. 6 graphically illustrates that the depth of maximum sensitivity can be moved by combining signals stimulated by different pulses.

The depth of maximum sensitivity can be moved by combining signals stimulated by different pulses, as seen in FIG. 6. Free Induction Decay signal amplitudes (FIDs) indicated by the curves 1–5 in FIG. 6 are stimulated by application of a 90° RF pulse ($H_1$). Increasing the RF pulse length moves the stimulated layer deeper into the sample, as shown progressively from curve 1 to curve 5. $H_1$ and the detection sensitivity both decrease exponentially with distance or depth (y/b) into the sample. Combining signals from different pulses (as shown by line 3–5, curve 3 minus curve 5, of FIG. 6) can reduce the surface sensitivity.

Figure 7A:
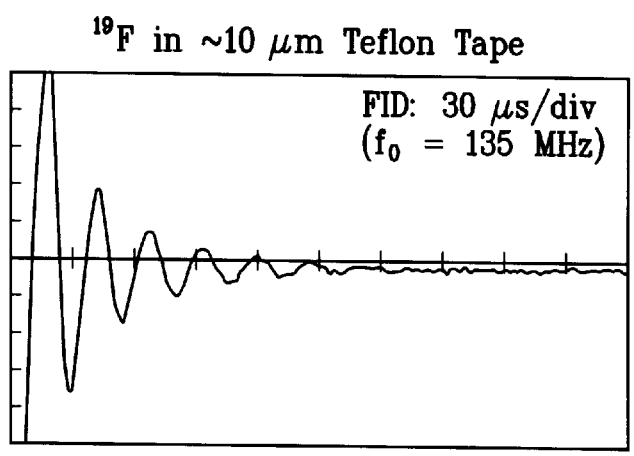
FIGS. 7A and 7B graphically illustrate test results of the miniature meanderline coil of the invention to obtain NMR signals from a thin, planar material, i.e., ~10 $\mu$m TEFLON® tape.
Figure 7B:
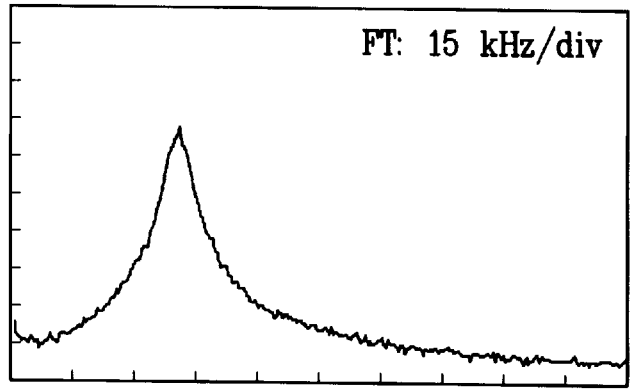

Experiments have been carried out which used the miniature meanderline coil to obtain NMR signals from thin, planar materials, with signal results being shown in FIG. 7A and its Fourier Transform in FIG. 7B, from about $5 \times 10^{19}$ fluorine atoms in ~10 $\mu$m TEFLON® tape at a resonance frequency, $f_0$ of 135 MHz. The signal results show a S/N≈30, comparable to protons in ~1 mg of water, with a solenoidal coil de-tuned to Q≈30. Thus, the meanderline geometry has about the same detection sensitivity as a solenoidal coil, but is specifically tailored to examine planar layers.

Figure 8A:
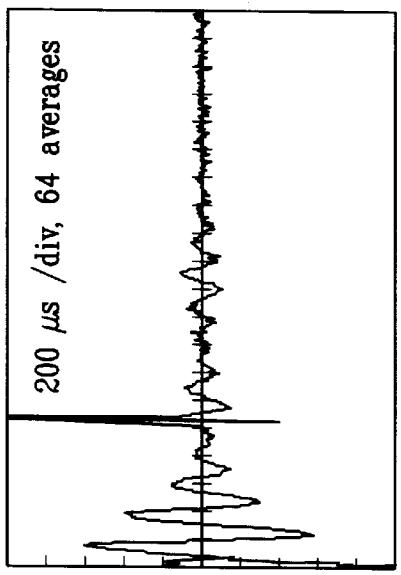
FIGS. 8A and 8B graphically illustrate a signal from a single crystal, i.e., GaAs, which shows sensitivity to orientation of the external field ($H_0$).
Figure 8B:
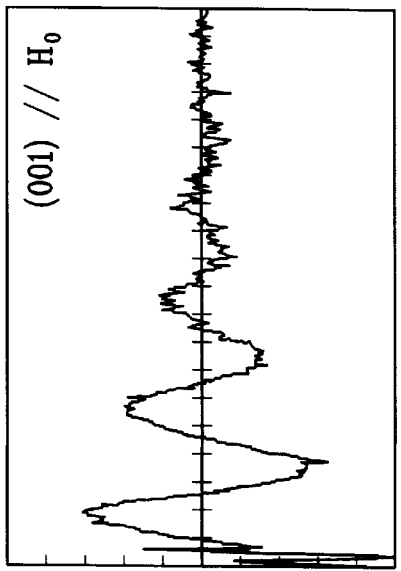

A signal from a single crystal shows sensitivity to orientation of the external field ($H_0$) as shown in FIGS. 8A–8B which detected $^{69}$Ga in a GaAs single crystal. Free induction decay signals: $f_0$+34.6 MHz, 30 $\mu$s/div, sixteen averages, with a single crystal of 10 mm×10 mm×0.3 mm size, meanderline element spacing=0.8 mm, and probe Q≈30. These signals show that NMR spectrum is broadened by magnetic dipole interactions with neighbors (coupling depends on angle between Ga—Ga vector and $H_0$).

Figure 9A:
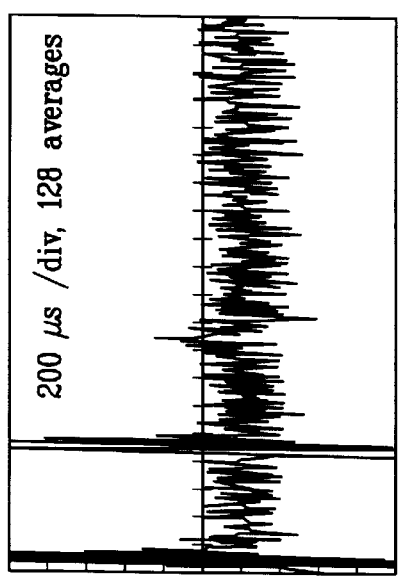
FIGS. 9A and 9B graphically illustrate that NMR echo signals can be generated by standard multiple pulse techniques using the meanderline surface coil of the present invention.
Figure 9B:
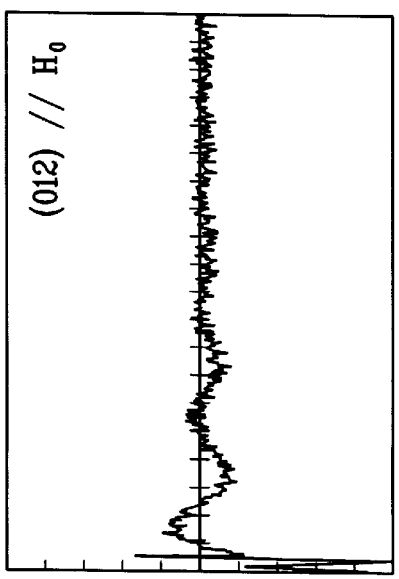

NMR echo signals can be generated by standard multiple pulse techniques, as shown in FIGS. 9A and 9B. Solid Echo (SE)(90-90$_{90}$), shown in FIG. 9A. QE from $^{69}$GaAs crystal (0,0,1)//$H_0$, which shows broadening is due to Ga—Ga dipole interaction. Quadrupole Echo (QE)(90—40$_{90}$), as shown in FIG. 9B: QE from $^{127}$I in KI powder (on tape), which shows the 90° —tau—40$_0$° sequence removes part of the electric quadrupole interaction. Generation of echo-signals requires uniform RF pulses: sample thickness<<meanderline spacing, and sample layer positioned at y≈½, the meanderline spacing.

FIG. 10 illustrates an embodiment of a micro-meanderline for thinner layers (thickness of <10 $\mu$m) fabricated using photolithography and printed circuit techniques. As shown in FIG. 10, this micro-meanderline surface coil generally indicated at 60 comprises an insulating substrate 61 on which is deposited a meanderline sensor 62 having ends thereof connected to solder pads 63 and 64. A pair of tuning chip capacitors 65 and 66 are deposited or mounted on substrate 61. For reference, two sample discs 67 and 68, with disc 67 being ⅜ inch diameter and disc 68 being ½ inch diameter are shown positioned over the meanderline 62.

By way of example the meanderline sensor 62 may be composed of gold or copper conductors, having a width of 5 mm, with the twenty (20) individual element lengths of 5 mm, width of 0.125 mm, and thickness of 10 μm. The solder pads 63 and 64 may be constructed of gold, or copper, as with the meanderline itself, the insulating substrate being composed of a ceramic, such as alumina, having a length of 22 and width of 18 mm. The tuning chip capacitors 65 and 66 are commercially available. Planar sample discs 67 and 68 of materials to be analyzed are placed adjacent to the meanderline, and be spaced from the meanderline sensor 62 by a distance of 10 to 100 μm. Studies using microcoils have found that NMR sensitivity increases by several orders. (See Olsen, et al., Science 270, 1967 1995).

The meanderline may be formed also by micro-machining the meanderline pattern and connections into a conductive or metallized layer on an insulating substrate. The meanderline can be further miniaturized to sub-millimeter dimensions overall, making it compatible with orthoscopic probes and utilization for Magnetic Resonance Imaging (MRI) procedures.

It has thus been shown that the present invention extends the capabilities of NMR to provide analysis of thin planar samples and surface layer geometries. By the use of miniature meanderline surface coils and micro-meanderline surface coils standard NMR techniques can be used to examine thin planar (or curved) layers, markedly extending NMRs utility. The NMR technique can now be used to examine contact layers without sensitivity to the bulk, provide non-destructive depth profile into films, or image multiple layers in a 3-D sense, as well as for chemical and physical analysis of layered materials. The invention will also find use in oil and gas exploration and borehole logging, environmental monitoring and control, site restoration and spill cleanup, paint and coating analysis, fluid flow measurement, and medical diagnostics.

While particular embodiment of the present invention have been illustrated and described along with selected materials and parameters to exemplify and teach the principles of the invention, such are not intended to be limiting. Modifications and changes may become apparent to those skilled in the art, and it is intended that the invention be limited only by the scope of the appended claims.

What is claimed is:

1. A miniature meanderline surface coil for use in nuclear magnetic resonance for examination of thin planar or curved layers, comprising:
   a plurality of parallel, uniformly spaced interconnected elements disposed on a substrate to form a meanderline plane, said elements comprising electrically conductive material is selected from the group consisting of platinum, gold, silver, copper, aluminum, and alloys thereof, each of said element having a length not greater than 1 cm, a width not greater than ½ mm, and a thickness of less than 0.1 mm, and wherein each said elements is spaced apart by a distance of less than 1 mm, said elements oriented and rotated with respect to an external magnetic field so as to maximize detection sensitivity of said surface coil, and
   one or more tuning capacitors formed on said substrate.

2. The miniature meanderline surface coil of claim 1, wherein said the meanderline surface coil and a sample are rotated about an axis parallel to the elements of the meanderline surface coil and tilted at an angle of 54.74°.

3. A nuclear magnetic resonance method, comprising the steps of:
   a.) providing a miniature meanderline surface coil, said coil having a length and width of not greater than 10 mm;
   b.) providing at least one thin, planar or curved layer to be examined;
   c.) positioning the layer to be examined at a distance of less than ½ mm from the surface coil;
   d.) placing the miniature meanderline surface coil and layer to be examined in a magnetic field wherein elements of the surface coil are parallel to the external magnetic field, and wherein further the RF field is perpendicular to the external magnetic field; and
   e.) tilting the miniature meanderline surface coil and layer with respect to said external magnetic field.

4. The nuclear magnetic resonance method of claim 3, additionally including spinning the miniature meanderline surface coil and the sample to be examined about an axis parallel to the parallel elements of the surface coil and tilted at an angle of 54.74°.

* * * * *